United States Patent
Kawazu et al.

[11] Patent Number: 5,966,602
[45] Date of Patent: Oct. 12, 1999

[54] NONVOLATILE SEMICONDUCTOR MEMORY AND FABRICATING METHOD THEREOF

[75] Inventors: Yoshiyuki Kawazu; Susumu Miyagi, both of Tokyo, Japan

[73] Assignee: Oki Electric Industry Co., Ltd., Tokyo, Japan

[21] Appl. No.: 08/805,679

[22] Filed: Feb. 27, 1997

[30] Foreign Application Priority Data

Sep. 4, 1996 [JP] Japan ................................ 8-253797

[51] Int. Cl.⁶ .................................................. H01L 21/8247
[52] U.S. Cl. ........................................ 438/258; 438/257
[58] Field of Search ..................................... 438/257–267

[56] References Cited

U.S. PATENT DOCUMENTS

| 5,103,274 | 4/1992 | Tang et al. . | |
|---|---|---|---|
| 5,270,240 | 12/1993 | Lee . | |
| 5,296,411 | 3/1994 | Gardner et al. . | |
| 5,376,571 | 12/1994 | Bryant et al. ........................... | 438/257 |
| 5,510,282 | 4/1996 | Hara ....................................... | 438/257 |
| 5,553,018 | 9/1996 | Wang et al. . | |
| 5,661,054 | 8/1997 | Kauffman et al. ...................... | 438/257 |
| 5,681,770 | 10/1997 | Ogura et al. ........................... | 438/257 |
| 5,731,242 | 3/1998 | Parat et al. ............................. | 438/586 |
| 5,736,442 | 4/1998 | Mori ........................................ | 438/257 |

FOREIGN PATENT DOCUMENTS 2 711 275   6/1994   France .
1-77160     3/1989   Japan .

OTHER PUBLICATIONS

H. Onoda et al., "A Novel Cell Structure Suitable For A 3 Volt Operation, Sector Erase Flash Memory" 1992, IEEE, IEDM 92–599 to 92–602.

Rama I. Hedge et al., "Growth and surface chemistry of oxynitride gate dielectric using nitric oxide" Appl. Phys. Lett. 66(21), May 22, 1995.

Primary Examiner—Richard Booth
Attorney, Agent, or Firm—Rabin & Champagne, P.C.

[57] ABSTRACT

A method of fabricating a nonvolatile semiconductor memory includes an oxide area forming step, a word line forming step, an etching step and a source area forming step in turn. In the oxide area forming step, oxide areas are formed in parallel bands. In the word line forming step, word lines are formed in parallel and perpendicularly to the oxide bands formed in the oxide area forming step. In the etching step, oxides, existing in areas between pairs of adjacent word lines in which source regions are to be formed, are etched, whereby field areas are created from the oxide areas. And in the source area forming step, areas functioning as source regions and source lines are formed between the word line pairs by doping impurity into the semiconductor substrate.

10 Claims, 14 Drawing Sheets

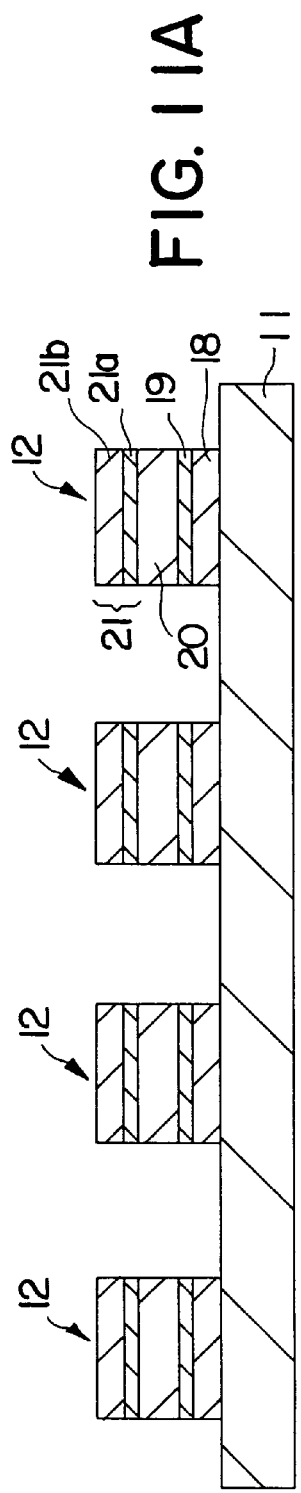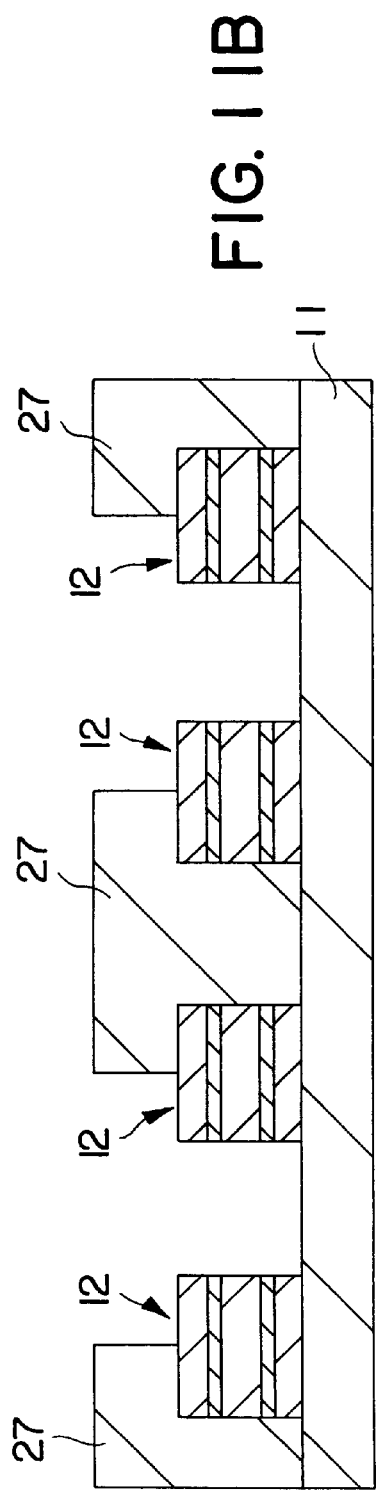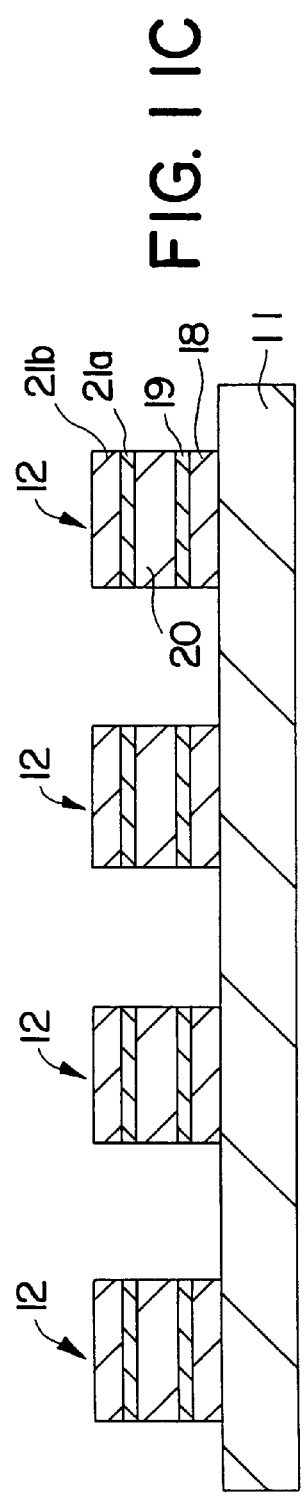

NONVOLATILE SEMICONDUCTOR MEMORY AND FABRICATING METHOD THEREOF

BACKGROUND OF THE INVENTION

1. Field of the Invention

The present invention relates to a nonvolatile semiconductor memory having plural memory cells each provided with a floating gate and a control gate, and to a method of the same.

2. Description of the Related Art

A type of nonvolatile semiconductor memory, in which transistors (memory cells), each having a floating gate and a control gate, are arranged in a matrix, is known. Such a nonvolatile semiconductor memory is provided with plural source lines, each electrically connected with source regions of transistors belonging to the same row. It is also provided with plural bit lines each electrically connected with drain regions of transistors belonging to the same column. Further, it is provided with plural word lines each including the floating gate and the control gate of the transistors belonging to the same row.

Conventionally, a nonvolatile semiconductor memory like this is fabricated in accordance with the following procedure.

First, a pad oxide layer (pad $SiO_2$ layer) and silicon nitride layer ($Si_3N_4$ layer) are formed on the entire surface of a silicon substrate (Si wafer). Subsequently, a resist pattern, which covers only areas where source lines and transistors will be created, is formed on the silicon nitride layer using lithography. Then, several processes, starting with an etching process are performed, whereby silicon dioxide areas, i.e., field areas for accomplishing isolation between memory cells, are formed on areas where no source line and no memory cell are formed.

Once the structure which has field areas and an area where no silicon dioxide exists (hereinafter, called active area) on the surface is completed, the entire surface is again covered with several layers for word lines. Thereafter, a resist pattern for patterning the layers is formed through lithography. The layers are then etched using the resist pattern as a mask, whereby the word lines are formed. After forming the word lines, a doping process is carried out. Then, an intermediate insulating layer covering the entire surface is formed. Further, a resist pattern, which covers areas except the drain regions, is formed on the intermediate insulating layer using lithography. Then, the intermediate insulating layer is etched using the resist pattern as a mask, and holes reaching the drain regions (i.e. drain contact holes) are formed. Thereafter, a conducting material (Al) is deposited on the surface, and the deposited conducting material is patterned, whereby the bit lines are formed.

Note that, for details of a fabrication procedure for a nonvolatile semiconductor memory like this, reference may be made for instance, to Japanese Patent Application Laid-Open No. 64-77160, published in 1989.

As stated above, in the conventional nonvolatile semiconductor memory, both the word lines and the source lines are formed using resist patterns (lithography). Therefore, when a nonvolatile semiconductor memory to be fabricated with the above structure is designed, intervals between the word lines and the source lines are determined with consideration given to the accuracy of alignment of the photomask. That is, intervals between the word lines and the source lines are designed in such a manner that a nonvolatile semiconductor memory of normal function can be obtained when the resist pattern is formed at a position distant from the standard position. As a result, in the conventional nonvolatile semiconductor memory, there are useless areas having no effect on the function around source lines.

Further, the conventional nonvolatile semiconductor memory also uses lithography when drain contact holes are formed. At this time, when the drain contact holes are directly in contact with the floating gates or the control gates of the word lines, a nonvolatile semiconductor memory which does not function normally is fabricated. Consequently, the design relative to the drain contact holes is also made with consideration given to the accuracy of alignment of the photomask. As a result, useless areas, which have no effect on the memory function, also exist around drain contact holes in the conventional nonvolatile memory.

SUMMARY OF THE INVENTION

Accordingly, it is an object of the present invention to provide a nonvolatile semiconductor memory capable of being fabricated compactly, and a method of fabricating such a compact nonvolatile semiconductor memory.

To accomplish the object given above, a nonvolatile semiconductor memory according to a first aspect of the present invention comprises: a semiconductor substrate in which field areas are formed; plural word lines formed on the semiconductor substrate in parallel; and source line areas, each of which functions as source regions and a source line, formed self-aligning with some pairs of adjacent word lines among the plural word lines.

Thus, the nonvolatile semiconductor memory according to the first aspect of the present invention has source line areas, each of which is formed self-aligning with two adjacent word lines and functions as source regions and a source line connecting with the source regions. That is, the present nonvolatile semiconductor memory has a structure in which an interval between a source line and a word line can be determined without consideration of errors produced by using lithography. Therefore, the nonvolatile semiconductor memory according to the first aspect of the present invention can be fabricated compactly.

A nonvolatile semiconductor memory according to a second aspect of the present invention comprises: a semiconductor substrate in which field areas are formed; plural word lines formed in parallel on the semiconductor substrate; insulating layers formed on the plural word lines so as to cover top surfaces and side surfaces toward drain regions of the plural word lines; and drain contact holes formed self-aligning with pairs of adjacent word lines among the plural word lines, in which drain regions are provided.

Thus, the nonvolatile semiconductor memory according to the second aspect of the present invention has word lines covered with insulating layers, and drain contact holes each formed self-aligning with two adjacent word lines. That is, the nonvolatile semiconductor memory has a structure in which the interval between two adjacent word lines having drain regions therein, can be determined without consideration of errors produced by the use of lithography. Therefore, the nonvolatile semiconductor memory according to the second aspect of the present invention can be fabricated compactly.

To accomplish the object given above, in a first method of fabricating a nonvolatile semiconductor memory according to the present invention, an oxide area forming step, a word line forming step, an etching step and a source area forming step are performed in this order.

In the oxide area forming step, plural oxide areas are formed in parallel bands in a semiconductor substrate. In the word line forming step, plural word lines are formed in the semiconductor substrate in parallel and rectangularly with the plural oxide areas formed in the oxide area forming step.

In the etching step, the oxides existing between pairs of adjacent word lines in which source regions are to be provided, are etched, whereby field areas are created from the plural oxide areas formed in said oxide area forming step. And in the source area forming step, areas functioning as source regions and source lines are formed between the pairs by doping the semiconductor substrate with an impurity.

That is, in the present fabricating method, the word lines are not formed after determining the areas in which the source lines are formed, but rather are formed in self-alignment with the word lines after forming the word lines, the source lines and the areas functioning as the source areas. Therefore, according to the present fabricating method, a nonvolatile semiconductor memory, which has no useless area between the word lines and the source lines, namely, is compact, can be fabricated.

Note that, when etching according to this method of fabricating a nonvolatile semiconductor memory, it is desirable to adopt an etching step in which a tapered profile is formed.

Moreover, in a second method of fabricating a nonvolatile semiconductor memory according to the present invention, a word line forming step, a doping step, a side wall forming step, an etching stopping layer forming step, a resist pattern forming step, an intermediate layer forming step, a drain contact hole forming step and a bit line forming step are performed in this order.

In the word line forming step, plural word lines, each of which has an insulating layer of a first insulating material as a top layer, are formed in parallel on the semiconductor substrate surface in which field areas are formed. In the doping step, impurity is doped into the semiconductor substrate after the word line forming step in order to create source and drain regions and source lines at areas except for the field areas. In the side wall forming step, side walls of second insulating materials are formed on side surfaces toward the drain regions of the plural word lines.

In the etching stopping layer forming step, a etching stopping layer is formed on the entire surface of the semiconductor substrate after the side wall forming step. In the intermediate insulating layer forming step, an intermediate insulating layer of a third insulating material, which is different from the material used for the etching stopping layer, is formed on the etching stopping layer. In the resist pattern forming step, a resist pattern having openings in areas corresponding to the drain regions is formed on the intermediate insulating layer.

In the drain contact hole forming step, drain contact holes are formed by etching the intermediate insulating layer using the resist pattern as a mask. In the bit line forming step, bit lines are formed by depositing a conducting material on the intermediate insulating layer in which drain contact holes are formed, and by patterning the deposited conducting material.

Thus, in this fabricating method, after formation of word lines (floating gates and control gates) covered with first and second insulating materials, an etching stopping layer covering the surface of the word lines is formed. Then, an intermediate insulating layer of a third insulating material, which is different from the material used for the etching stopping layer, is formed on the etching stopping layer. Thereafter, drain contact holes are cut by etching the intermediate layer and the etching stopping layer above the drain regions.

That is, in this fabricating method, each drain contact hole is formed self-aligned with two adjacent word lines covered with insulating material. Therefore, according to the present fabricating method, a nonvolatile semiconductor memory, which has no useless area between the word lines and the drain contact holes, namely, is compact, can be fabricated.

In a third method of fabricating a nonvolatile semiconductor memory according to the present invention, a word line forming step, a doping step, a side wall forming step, an intermediate layer forming step, a drain contact hole forming step and a bit line forming step are performed in this order.

In the word line forming step, plural word lines, each of which has an insulating layer of a first insulating material as a top layer, are formed in parallel on the semiconductor substrate surface in which field areas have been formed. In the doping step, impurity is doped into the semiconductor substrate after the word line forming step, whereby source and drain regions and source lines, are created at areas except for the field areas.

In the side wall forming step, side walls of second insulating materials are formed on the side surfaces toward the drain regions of the plural word lines. In the intermediate insulating layer forming step, the third insulating material of the intermediate insulting layer is different from the first insulating material and the second insulting material, and is formed on the entire semiconductor surface after the side wall forming step.

In the resist pattern forming step, a resist pattern, which has openings in areas corresponding to the drain regions, is formed on the intermediate insulating layer. In the drain contact hole forming step, drain contact holes are formed by etching the intermediate insulating layer using the resist pattern as a mask. In the bit line forming step, bit lines are formed by depositing a conducting material on the intermediate insulating layer in which drain contact holes are formed, and by patterning the deposited conducting material.

That is, in the third fabricating method, instead of forming an etching stopping layer between the word lines covered with first and second insulating material and the intermediate layer, a material different from the first insulating material and the second insulating material is used as the third insulating material for the intermediate insulating layer. When fabricating a nonvolatile semiconductor memory using this fabricating method, each drain contact hole is also formed to be self-aligning with two adjacent word lines covered with insulating materials. Therefore, according to the present fabricating method, a compact nonvolatile semiconductor memory can be fabricated similarly to the second fabricating method.

In a fourth method of fabricating a nonvolatile semiconductor memory according to the present invention, an oxide area forming step, a word line forming step, an etching step, a source/drain forming step, a side wall forming step, an intermediate insulating layer forming step, a drain contact hole forming step and a bit line forming step are performed in this order.

In the oxide area forming step, plural oxide areas are formed in parallel bands in a semiconductor substrate. In the word line forming step, plural word lines are formed in parallel and rectangularly with the plural oxide areas, on the semiconductor substrate in which the plural oxide areas are formed. In the etching step, oxides existing between pairs of adjacent word lines, in which areas source regions are to be formed, are etched away, whereby field areas are created from the plural oxide areas formed in the oxide area forming step.

In the source/drain forming step, by doping impurity into the semiconductor substrate, areas which function as source regions and source lines are formed in the areas between the word line pairs, and areas which function as drain regions are formed in areas surrounded by two field areas and two word lines. In the side wall forming step, side walls of second insulating materials are formed on side surfaces toward the drain regions of the plural word lines. In the etching stopping layer forming step, an etching stopping layer is formed on the entire surface of the semiconductor substrate after the side wall forming step. In the intermediate insulating layer forming step, an intermediate insulating layer of a third insulating material, which is different from the material used for forming the etching stopping layer, is formed on the etching stopping layer.

In the resist pattern forming step, a resist pattern, having openings in areas corresponding to the drain regions, are formed on the intermediate insulating layer. In the drain contact hole forming step, drain contact holes are formed by etching the intermediate insulating layer using the resist pattern as a mask. In the bit line forming step, bit lines are formed by depositing a conducting material on the intermediate insulating layer in which drain contact holes are formed, and by patterning the deposited conducting material.

That is, in the fourth fabricating method, the formation of source lines and source regions is carried out by using the first fabricating method, and formation of drain contact holes is carried out by using the second fabricating method. Consequently, the present fabricating method can be used to fabricate a nonvolatile semiconductor memory in which there is no useless area between word lines and source lines and between word lines and drain contact holes.

Note that, when fabricating a nonvolatile semiconductor memory by using the second fabricating method, an etching stopping layer can be adopted which is formed of a fourth insulating material (e.g. silicon nitride). In this case, however, a drain contact hole forming step must be performed by etching the intermediate insulating layer and etching the etching stopping layer not covered with the intermediate layer.

Moreover, when using silicon nitride as a material for the etching stopping layer, in order to prevent hydrogen from being stored below the word lines, it is desirable to form the etching stopping layer to have openings in areas except the drain regions.

Further, in order to prevent hydrogen from being stored below the word lines, there may be adopted a word line forming step which includes a first forming step, a treatment step and a second forming step. In the first forming step, a first layer is formed, which will eventually form the gate oxides of the word lines. In the treatment step, the semiconductor substrate, on which the first layer is formed is thermally treated in nitrogen oxide gas. In the second forming step, second through fifth layers, which will eventually form the floating gate, inter-gates insulating layer, control gate and insulating layer, respectively, are formed on the first layer after the treatment step.

Moreover, when fabricating a nonvolatile semiconductor memory by using the second fabricating method, there may be adopted the etching stopping layer forming step in which an etching stopping layer, of a conducting material (e.g., polysilicon or tungsten silicide or tungsten) and consisting of etching stopping parts each covering one drain regions, is formed.

Further, when fabricating a nonvolatile semiconductor memory by using the fourth fabricating method, there may be adopted a word line forming step which includes a layers forming step, a resist pattern forming step, a first etching step and a second etching step.

In the layers forming step, first through sixth layers are formed, which will eventually provide gate oxides, floating gates, inter-gate insulating oxides, control gates, intermediate layers and insulating layers, respectively. In the resist pattern forming step, a resist pattern that defines shapes of word lines is formed on the sixth layer formed in the layers forming step. In the first etching step, third through sixth layers are etched using the resist pattern as a mask, thereby forming inter-gate insulating oxides and control gates and insulating layers. In the second etching step, after removing the resist pattern, the second layer is etched using the insulating layers formed in the first etching step as a mask, in order to form floating gates.

Note that, when adopting this word line forming step, it is desirable to use the layers forming step in which a polysilicon layer and a silicon dioxide layer are formed as the first and second layers, respectively, and the second etching step in which the second layer is etched using gas that includes no carbon.

BRIEF DESCRIPTION OF THE DRAWINGS

Other objects and advantages of the present invention will become apparent during the following discussion in conjunction with the accompanying drawings, in which:

FIGS. 11A through 11C are sectional views of assistance in explaining the method of fabricating nonvolatile semiconductor memories in accordance with the third embodiment;

DETAIL DESCRIPTION OF THE PREFERRED EMBODIMENTS

Preferred embodiments of the present invention will now be described with reference to the accompanying drawings.
First Embodiment In the method of fabricating nonvolatile semiconductor memories according to the first embodiment, nonvolatile semiconductor memories are formed with no useless area between word lines and source lines.

The present fabricating method will be hereinafter discussed with the reference to FIGS. 1A–1E.

Figure 1A:
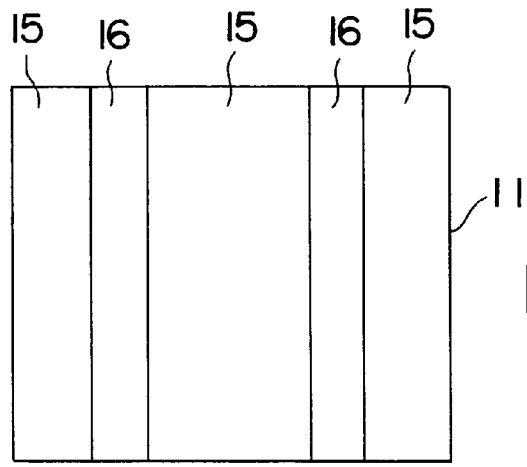
FIGS. 1A through 1E are planar views of assistance in explaining a method of fabricating nonvolatile semiconductor memories in accordance with a first embodiment.

When a nonvolatile semiconductor memory is fabricated by the present method, first, as shown in FIG. 1A, silicon dioxide areas (field areas 15) are formed in a semiconductor substrate 11 except for active areas 16 in each of which memory cells belonging to the same column will be formed. Note that, in this embodiment, a p-channel silicon, single-crystal substrate is used as the semiconductor substrate 11, and the field areas 15 are formed by the LOCOS (local oxidation of silicon) method. Moreover, the sizes of the respective portions in this nonvolatile semiconductor memory are designed in accordance with the 0.35 $\mu$m design rule. Thus, the field areas 15 and the active areas 16 are formed in such a manner that the widths thereof become 0.8 $\mu$m and 0.4 $\mu$m, respectively.

Figure 1B:
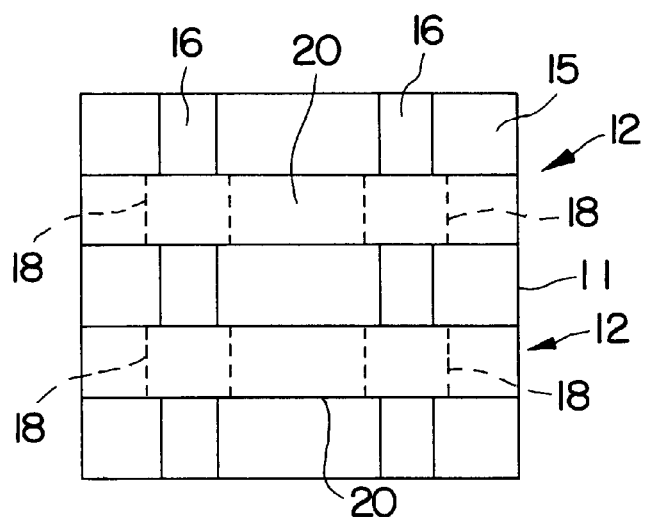

Subsequently, as schematically shown in FIG. 1B, the word lines 12 including gate oxide, floating gates 18, an inter-gates insulating layer and control gates, and extending in the direction rectangularly with (perpendicular to) the active areas 16 are formed on the semiconductor substrate 11. In this embodiment, similarly to the conventional nonvolatile semiconductor memories, the floating gates 18 are formed of polysilicon and the control gates are formed of tungsten silicide. Both a gate oxide layer under the floating gate 18 and an inter-gate insulating layer between the floating gate and the control gate are formed of a silicon dioxide. Moreover, each word line 12 is formed in such a manner that the width thereof becomes 0.5 $\mu$m, the interval between a pair of word lines providing an area to form source regions, becomes 0.36 $\mu$m (center interval is 0.86 $\mu$m), and the interval between a pair of word lines providing an area to form a drain region, becomes 1.2 $\mu$m (center interval is 1.7 $\mu$m).

Figure 1C:
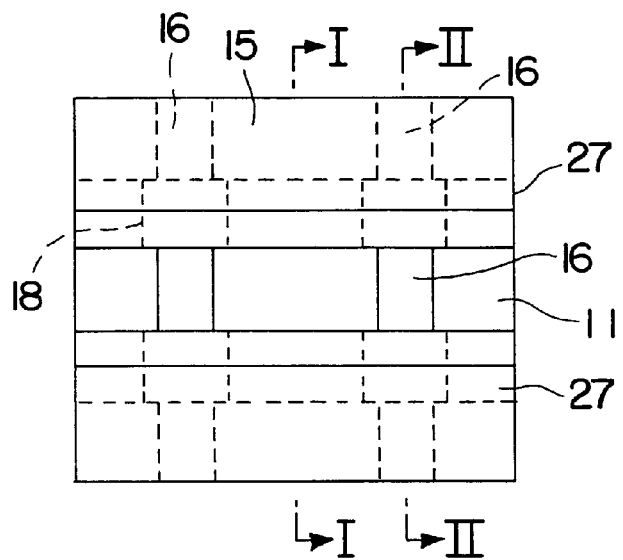

As will be described in detail later, the former interval is 0.4 $\mu$m shorter than that of the conventional nonvolatile semiconductor memory and the latter interval is the same as that of the conventional nonvolatile semiconductor memory. Thereafter, a resist pattern 27, which covers areas between two adjacent word lines 12 on every other area as shown in FIG. 1C, is formed through lithography. Then, a dry etching process for removing silicon dioxide is carried out by using the resist pattern 27 as a mask.

Note that, as stated above, the top layer (control gate 20) of word line 12 is formed of tungsten silicide, which is a material having similar etching-proof characteristics to those of the resist pattern 27. Hence, the resist pattern 27 having openings larger than the areas can be used for removing silicon dioxide existing between the word lines 12.

Figure 2A:
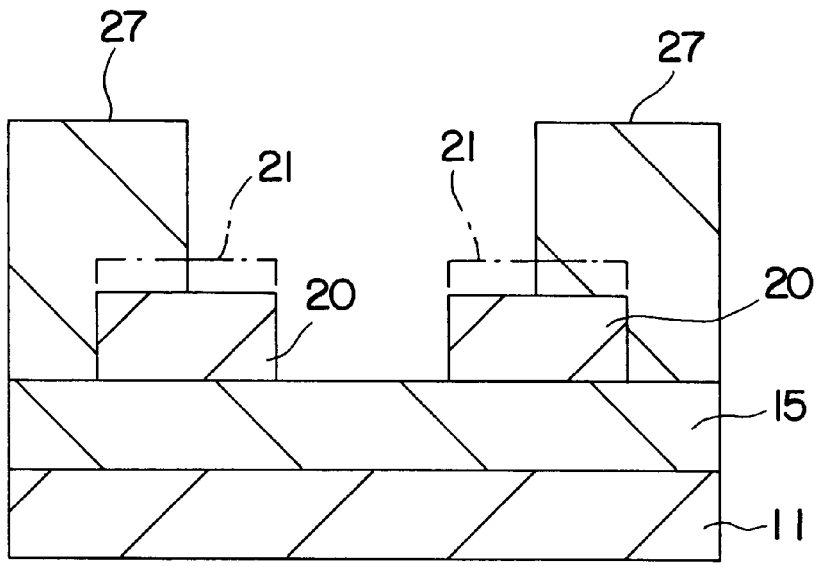
FIGS. 2A and 2B are sectional views in a portion in which field areas are formed, of assistance in explaining the method of fabricating nonvolatile semiconductor memories in accordance with the first embodiment.
Figure 2B:
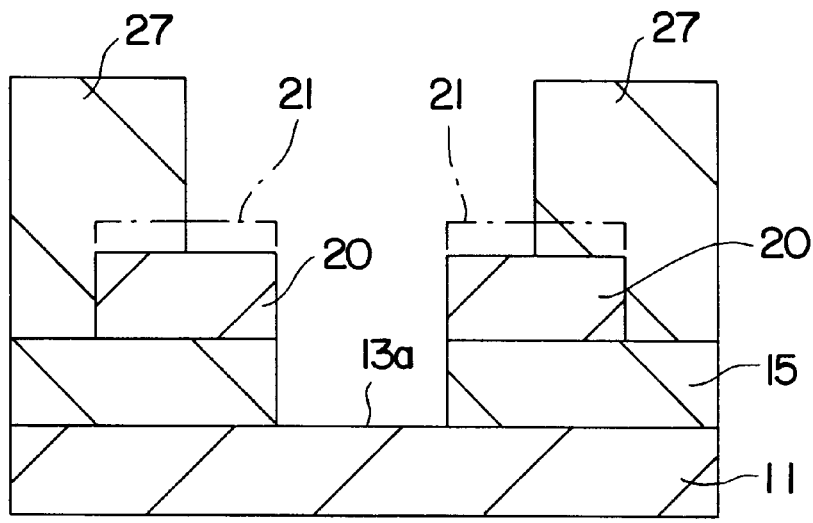
Figure 3:
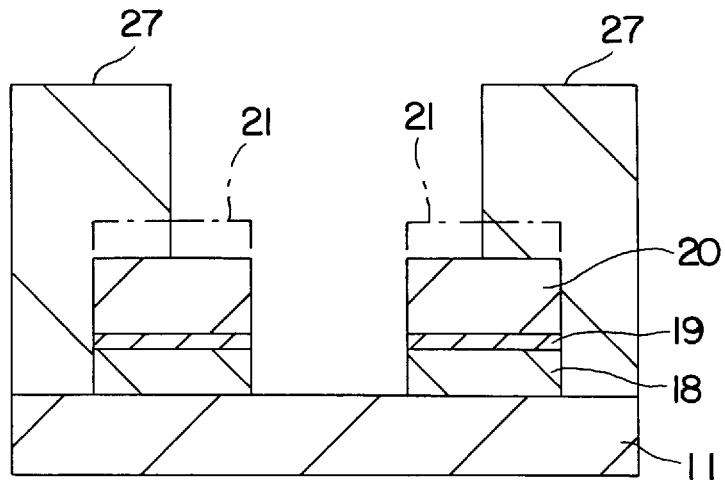
FIG. 3 is a sectional view in a portion in which no field area is formed, of assistance in explaining the method of fabricating nonvolatile semiconductor memories in accordance with the first embodiment.

In this dry etching process, concerning portions in which the field areas 15 are formed, (such as the portions indicated by the line I—I in FIG. 1C), the field areas 15 (silicon dioxide) located at the openings of the resist pattern 27 and formed between two word lines 12 (control gates 20), are removed as shown in FIGS. 2A, 2B. On the other hand, in portions in which no field area 15 is formed (such as the portions indicated by the line II—II in FIG. 1C), since there is no silicon dioxide between the word lines 12 as shown in FIG. 3, little change of the structure occurs in this etching process. (The gate oxide, which exists between the silicon substrate 11 and the floating gate 18, is omitted from the view in FIG. 3.)

Figure 1D:
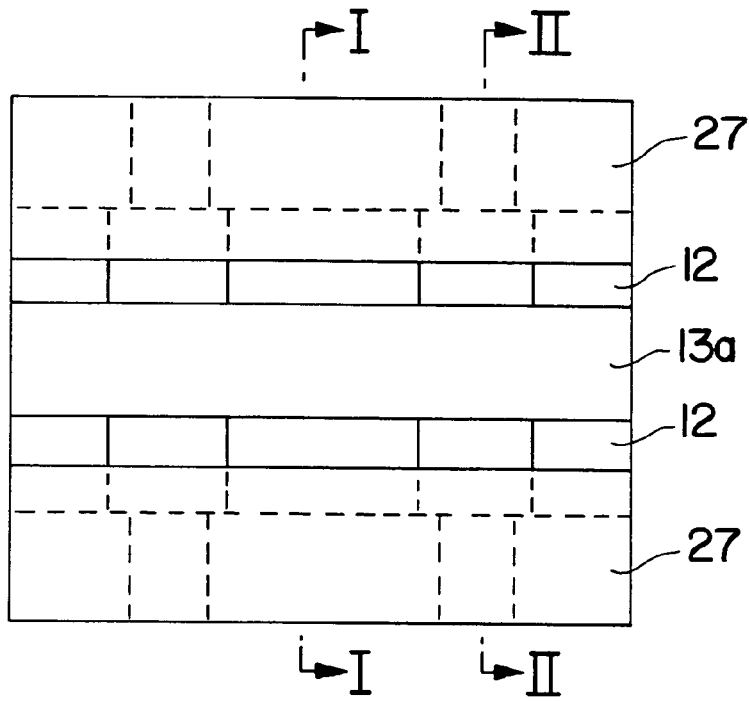

After all, through the dry etching, a structure with source line areas 13a which subsequently will be source lines and source regions and having no oxide on their surface, are obtained as shown in FIG. 1D.

Figure 1E:
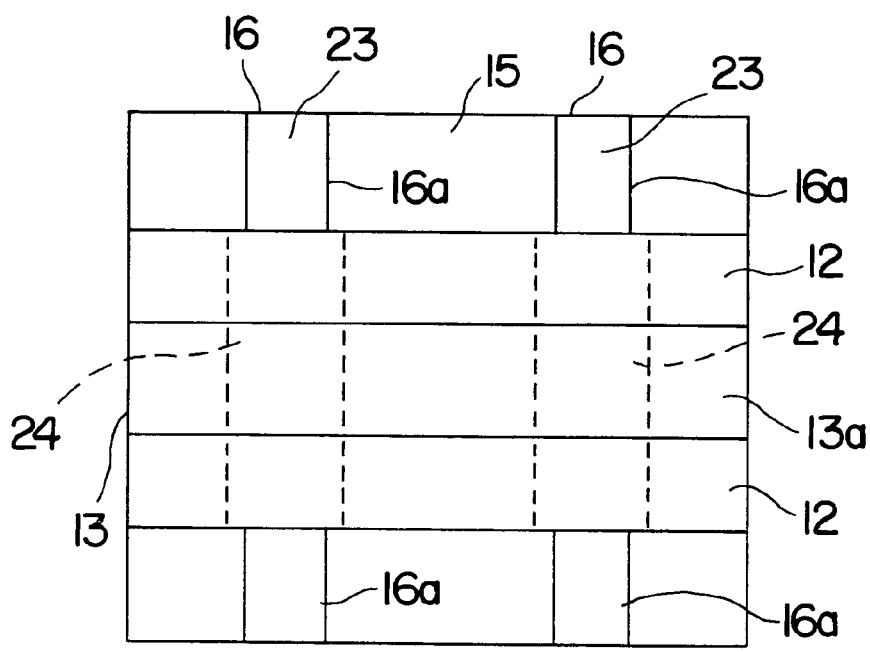

The resist pattern 27 is removed after the formation of the source line areas 13a. Thereafter, impurity is implanted into the entire surface, and the substrate is thermally treated so that the implanted impurity may diffuse. Through these processes, drain regions 23 are formed at the exposure portions 16a, and source regions 24 and a source line 13 are formed at the source line area 13a, as shown in FIG 1E.

In this embodiment, after forming the source lines and the source/drain regions, the conventional process is performed to complete the nonvolatile semiconductor memory. That is, after forming the source lines and the source/drain regions, an intermediate insulating layer is formed so as to cover the entire surface of the structure shown in FIG. 1E. Subsequently, drain contact holes reaching the respective drain regions 23 are cut in the intermediate insulating layer using a resist pattern. Then, bit lines, each connecting with the drain regions 23 of the memory cells belonging to the same column, are formed by depositing conducting material (aluminum in this embodiment) on the intermediate insulating layer and patterning the deposited conducting material.

As above described, in the fabricating method of the first embodiment, the source line areas 13a which will eventually be the source lines 13 and source regions 24, are formed by etching silicon oxides (parts of field areas 15 formed first) on the substrate using some pairs of two adjacent word lines 12 as a mask. That is, in this fabricating method, each source line 13 is formed self-aligning with two adjacent word lines putting source regions thereinto. Therefore, when designing a nonvolatile semiconductor memory to be fabricated by this method, the interval between the word line and the source line can be determined without consideration of errors produced by using lithography. As a result, the interval between the word lines 12 in which source regions are provided, can be set 0.4 μm shorter (0.2 μm shorter per one memory cell) than that of the nonvolatile semiconductor memory fabricated by using the conventional method as stated above.

Figure 4:
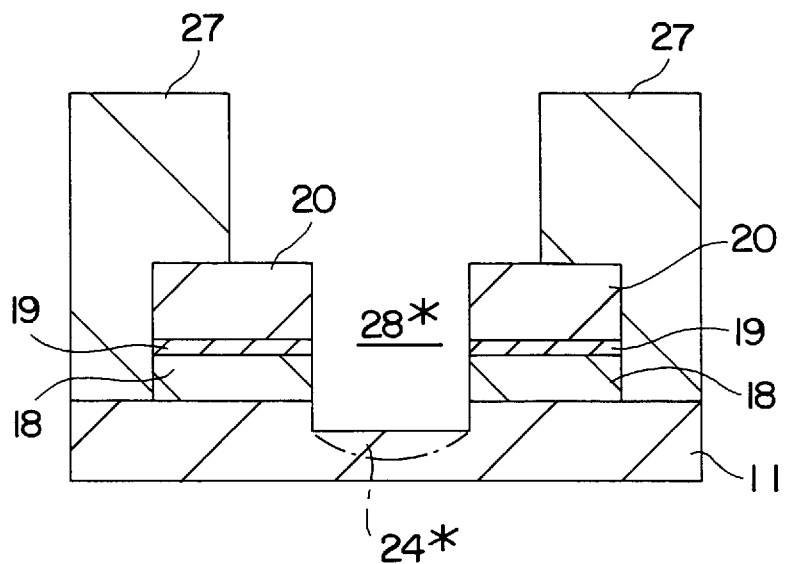
FIG. 4 is a sectional view of assistance in explaining a problem when field areas are etched by using a high anisotropy etching.

Note that, since the dry etching to form the source line areas 13a is performed so that silicon dioxide is etched and silicon is not etched, areas of the semiconductor substrate 11 not covered with the silicon dioxide (field areas 15) usually are not etched. However, there is a case in which silicon is etched because of the variation in the etching condition. When silicon is etched, a concave portion 28* of a shape shown in FIG. 4 is formed. In case the ion implantation and heat treatment are performed upon the structure with the concave portion 28*, the implanted ions are not sufficiently diffused under the word lines 12. As a result, no channel of the desired electrical characteristic is formed under the word lines 12, whereby a nonvolatile semiconductor memory of non-desired characteristic is obtained.

Figure 5:
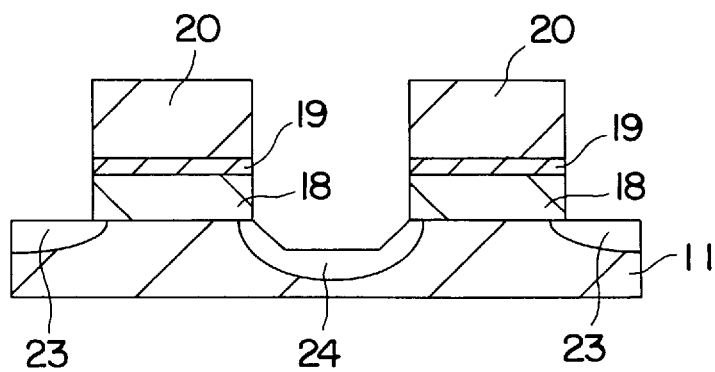
FIG. 5 is a sectional view of assistance in explaining an etching condition used when field areas on source line areas are removed in the method of fabricating nonvolatile semiconductor memories in accordance with the first embodiment.

Therefore, when forming the source line areas 13a, an etching condition can form, as shown in FIG. 5, in which concave portion 28* has a deepness which varies gently in the vicinity of the border of the word lines 12. That is, it is desirable to use the etching condition which can form the concave portion 28* with a tapered profile. Such an etching process is actualized, for example, by increasing the etching pressure, reducing the high frequency power used to produce plasma, or increasing a partial pressure with a gas that includes carbon, which is easy to form from a polymerized layer by sedimentation.

Second Embodiment

In a method of fabricating a nonvolatile semiconductor memory in accordance with the second embodiment, a nonvolatile semiconductor memory in which there is no useless area between drain contact holes and word lines is fabricated.

A method of fabricating a nonvolatile semiconductor memory in accordance with the second embodiment will be hereinafter discussed with reference to FIGS. 6A–6E and 7A–7E. Note that FIGS. 6A–6E are plan views of assistance in explaining this method. In these figures, areas for four memory cells are shown. FIGS. 7A through 7E are sectional views wherein the semiconductor substrate is cut in a direction perpendicular to the direction of the word line 12, and in a manner that memory cells are passed.

Figure 6A:
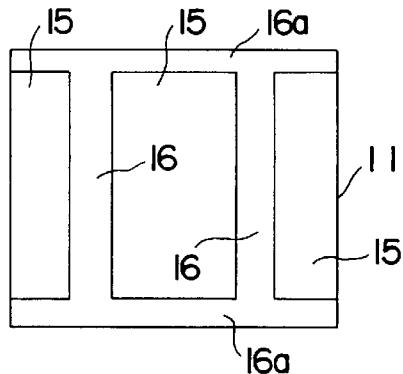
FIGS. 6A through 6D are planar views of assistance in explaining a method of fabricating nonvolatile semiconductor memories in accordance with a second embodiment.

In this fabricating method, as shown in FIG. 6A, a rectangle field area 15 is formed in such a manner that an active area 16 to be drain regions, source areas and the like and active areas 16a to be source lines, remain surrounding the field area 15. Moreover, the field area 15 is formed in a manner that the width of the active area 16a becomes 0.18 μm and the interval thereof becomes 2.0 μm, and the width of the active area 16 becomes 2.0 μm, and the width of the active area 16 becomes 0.4 μm and the interval thereof becomes 0.8 μm.

Figure 7A:
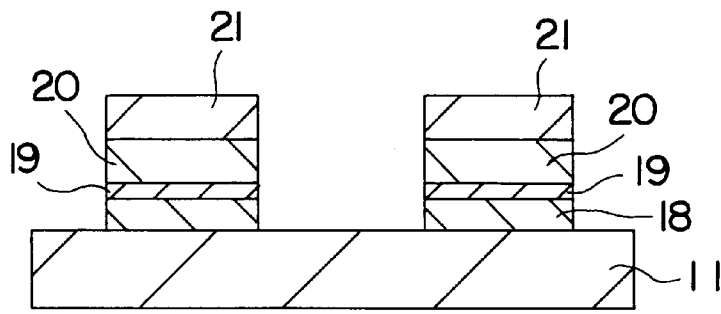
FIGS. 7A through 7G are sectional views of assistance in explaining the method of fabricating nonvolatile semiconductor memories in accordance with the second embodiment.

Subsequently, plural word lines 12 are formed in parallel on the substrate 11, in areas in which the field areas 15 are formed, so that each word line 12 does not overlap the active areas 16a and two word lines 12 are located on each field area 15 by using well-known techniques including lithography. Note that the word lines 12 in this step, as shown in FIG. 7A, each have a structure in which a gate oxide (not shown), a floating gate 18, an inter-gates insulating layer 19, a control gate 20 and an insulating layer 21 are laminated.

Moreover, each word line 12 is formed in such a manner that the width becomes 0.5 μm, a pair of the word lines putting the active area 24 thereinto becomes 0.76 μm (center interval is 1.26 μm), and a pair of the word lines putting no active area 24 thereinto becomes 0.6 μm (center interval is 1.1 μm). As will be described later in detail, the former interval is the same interval as that of a nonvolatile semiconductor memory fabricated by the conventional method, and the latter interval is 0.6 μm shorter than that of the memory.

Figure 6B:
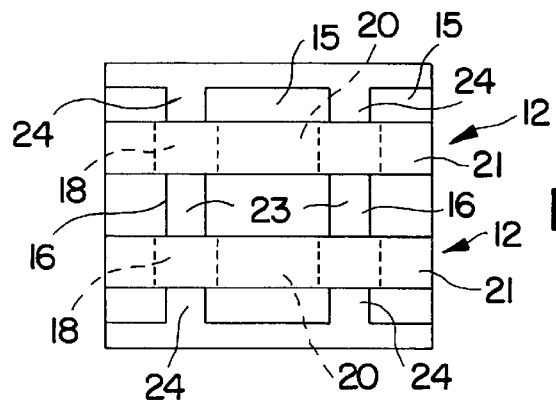
Figure 7B:
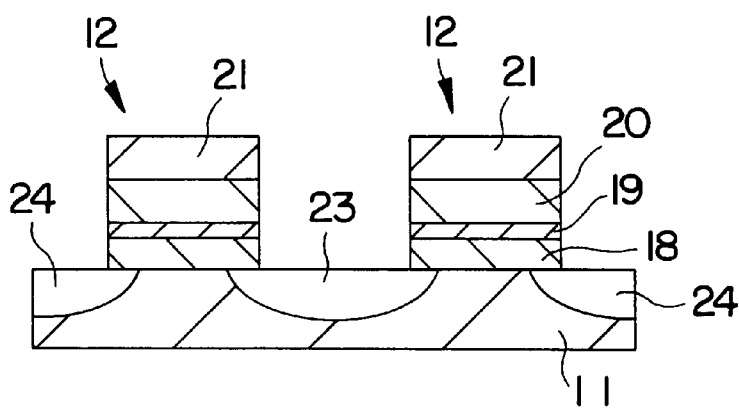

After forming the word lines 12, the ion implantation of impurity and the heat treatment are performed, and, as shown in FIGS. 6B and 7B, a structure is formed in which the active areas 16 at the sides of the active areas 16a function as source areas 24 and the active area 16 between the word lines 12 functions as the drain region 23.

Figure 6C:
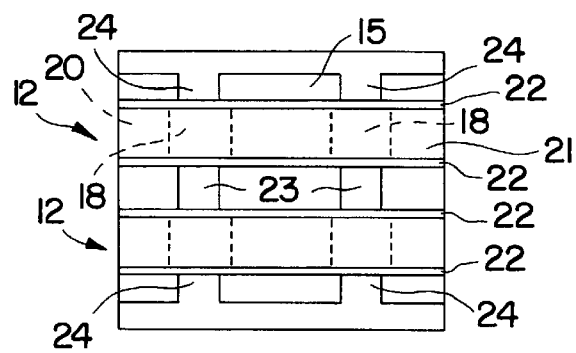
Figure 6D:
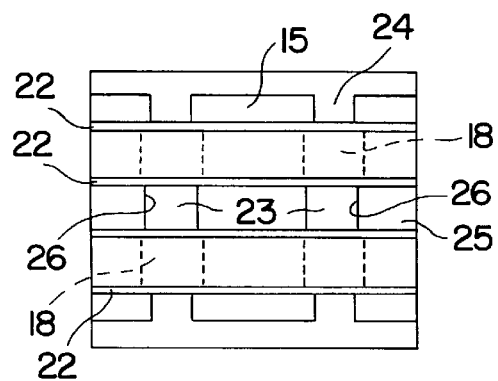
Figure 7C:
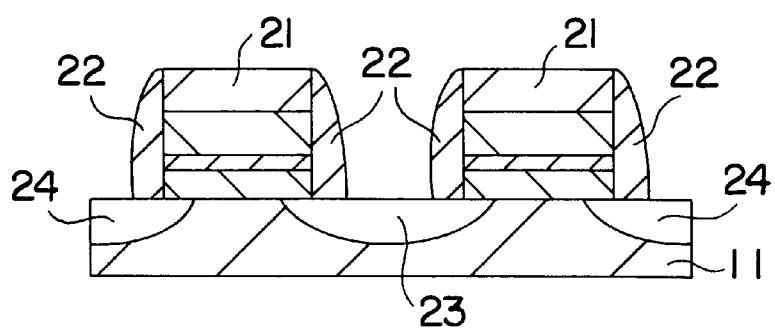
Figure 7D:
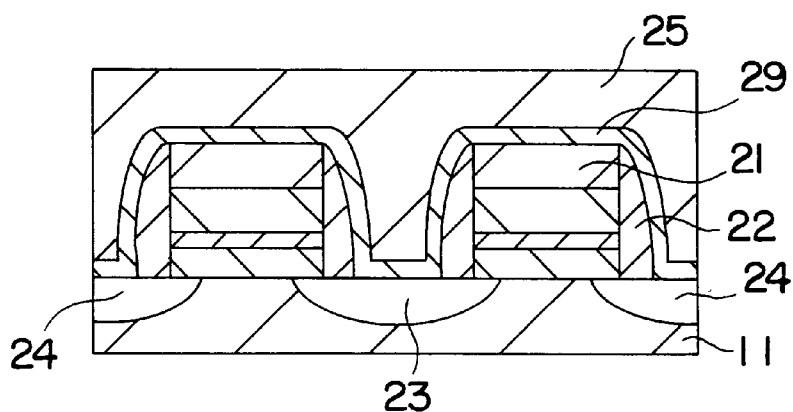

Thereafter, as shown in FIGS. 6C and 7C, side walls 22 are formed at the sides of the word lines 12. Then, a shown in FIG. 7D, an etching stopper layer 29 and an intermediate insulating layer 25 are formed on the surface of the structure in which the side walls 22 are formed.

Note that, in this embodiment, the side walls 22 are formed by depositing silicon dioxide in such a manner that the thickness W thereof becomes 0.2 μm. And, the etching stopper layer 29 is formed by depositing silicon nitride. Further, the intermediate insulating layer 25 is formed by depositing silicon dioxide.

Figure 7E:
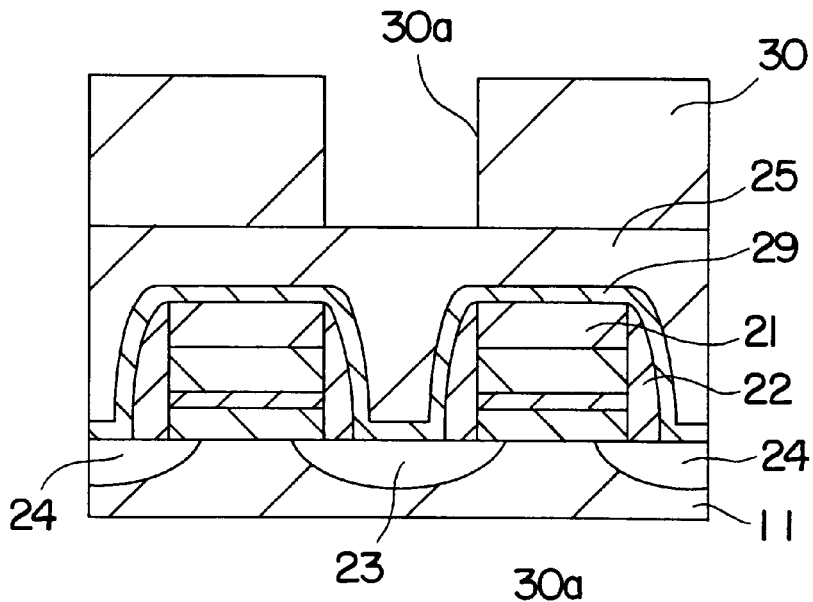
Figure 7F:
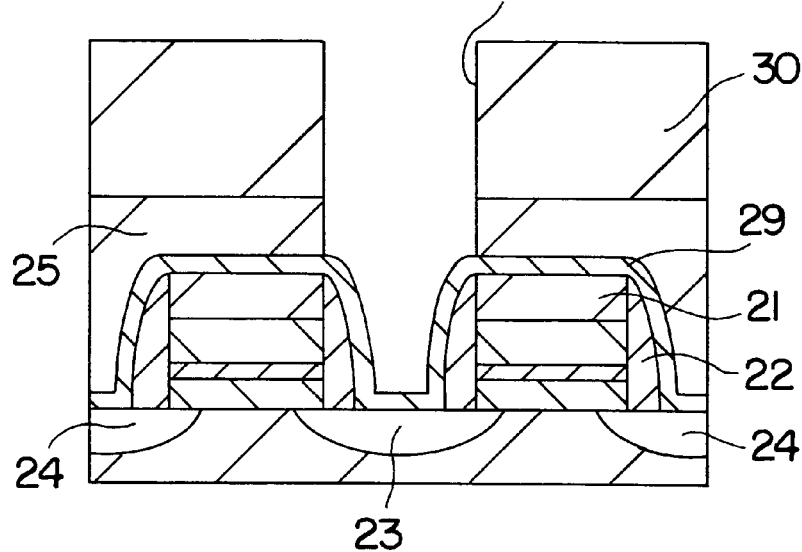

Next, as shown in FIG. 7E, a resist pattern 30 for cutting drain contact holes is formed on the intermediate insulating layer 25 by using lithography. Thereafter, the etching of the intermediate insulating layer 25 is performed by using the resist pattern 30 as a mask, whereby a structure is formed as shown in FIG. 7F, in which all of the portion of the intermediate insulating layer 25 on the etching stopper layer 29 under the openings of the resist pattern 30, is removed. After removing the resist pattern 30, portions of the etching stopper layer 29, which are not covered by the intermediate insulating layer 25, are removed by etching, whereby a structure, as shown in FIG. 7G, having drain contact holes 26, sectional shapes of which are defined by the side walls 22, is obtained.

Figure 7G:
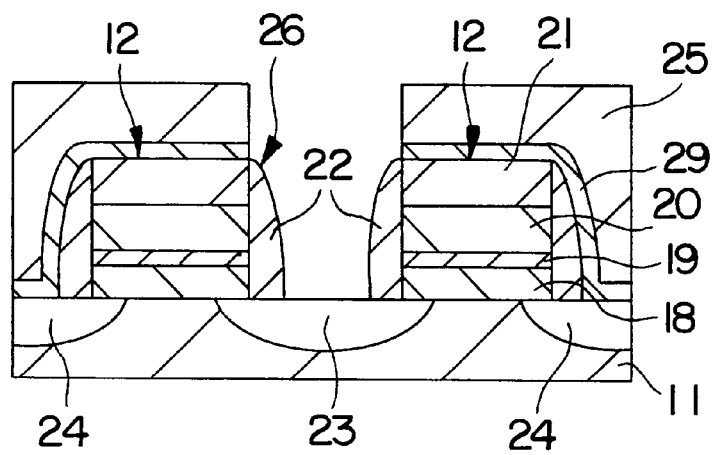

Thereafter, conducting material (aluminum) is deposited on the entire surface of the structure shown in FIG. 7G (in the drain contact holes 26 and on the intermediate insulating layer 25), and the deposited material is patterned for forming bit lines.

Thus, in this fabricating method, the resist pattern 30 formed on the intermediate insulating layer 25 is used as a pattern for removing the intermediate insulating layer 25 on the etching stopper layer 29, but it is not used as a pattern for determining the shape of the drain contact hole 26. Consequently, even if the resist pattern 30 is formed at a position distant (e.g. 0.1 μm distant) from the standard position, there is no change in the shape of the drain contact hole 26 at the side of the substrate 11. Besides, since the insulating layer 21 is provided on the control gate 20, there is no problem, though a part of the etching stopper layer 29 on the word line 12 is removed as a result of the opening of the resist pattern 30 being out of position.

According to this fabricating method, it is necessary to form the resist pattern 30 with lithography when the drain contact hole 26 is formed. However, it is unnecessary to improve the accuracy of the resist pattern 30. Thus, when nonvolatile semiconductor memories are fabricated by this fabricating method, it is unnecessary to design the interval between the word lines 12 in consideration of the alignment accuracy while forming the resist pattern 30, and as a result, compact nonvolatile semiconductor memories can be fabricated.

Note that, in this embodiment, since the etching stopper layer 29 is formed with insulating materials (silicon nitride), it is necessary to remove the etching stopper layer 29 on the drain region 23 while forming the drain contact hole. However, the only characteristic necessary for the etching stopper layer 29 is that the etching speed of the etching stopper layer 29 be slower than that of the intermediate insulating layer 25. Thus, the etching stopper layer 29 is formed of conducting materials such as polysilicon, tungsten, whereby no process of removing the etching stopper layer 29 is needed. However, when the etching stopper layer 29 formed of conducting material is used, to prevent a short between the drain region 23 and the source area 24, or between the drain regions 23 arranged in the direction of the word line 12 via the etching stopper layer 29, the etching stopper layer 29 must be discontinuous. Thus, lithography is used when the etching stopper layer 29 is formed. However, only the etching stopper layer 29 is formed not to short between the drain region 23 and the source area 24 and the like, so that no limitation is imposed on the design of the word line 12 and the like by the alignment accuracy during lithography. As a result, though the etching stopper layer 29 is formed of conductive materials, compact nonvolatile semiconductor memories can be fabricated.

Now, when the etching stopper layer 29 of silicon nitride is formed by CVD, hydrogen breaks into the interface between the word line 12 and the substrate 11. As shown in FIG. 7G, in this fabricating method, a nonvolatile semiconductor memory is fabricated in which the etching stopper layer 29 remains at the source area 24 and at the side surface of the source area 24 of the word line 12, so that there are some cases in which this hydrogen is stored in the interface.

The hydrogen storage in the interface varies the threshold voltage. Thus, when the etching stopper layer 29 of silicon nitride is used in this fabricating method to prevent the hydrogen from being stored in the interface, it is desirable to use either a first process or a second process as explained as follows.

First, the first process is explained referring to FIGS. 8A–8E. In the first process, the etching stopper layer 29 is patterned, and then the intermediate insulating layer 25 is formed.

Figure 8A:
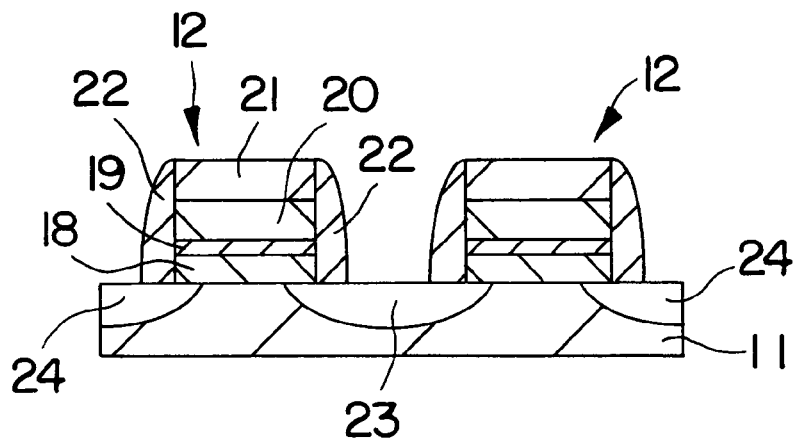
FIGS. 8A through 8E are sectional views of assistance in explaining a first process used when an etching stopper layer is formed in the method of fabricating nonvolatile semiconductor memories in accordance with the second embodiment.
Figure 8B:
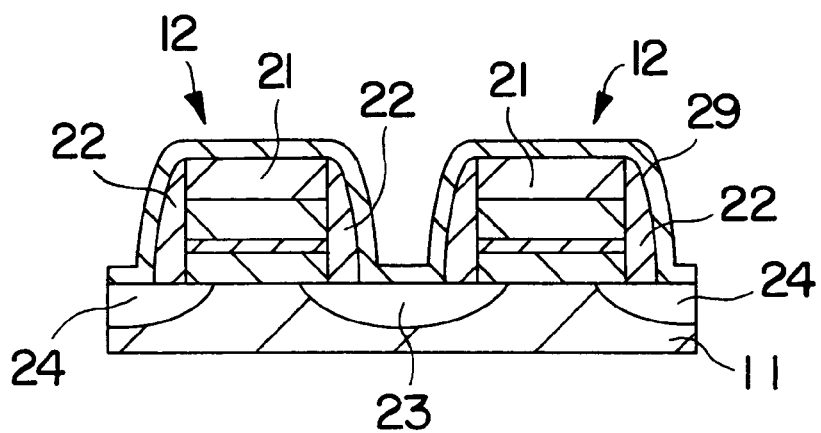
Figure 8C:
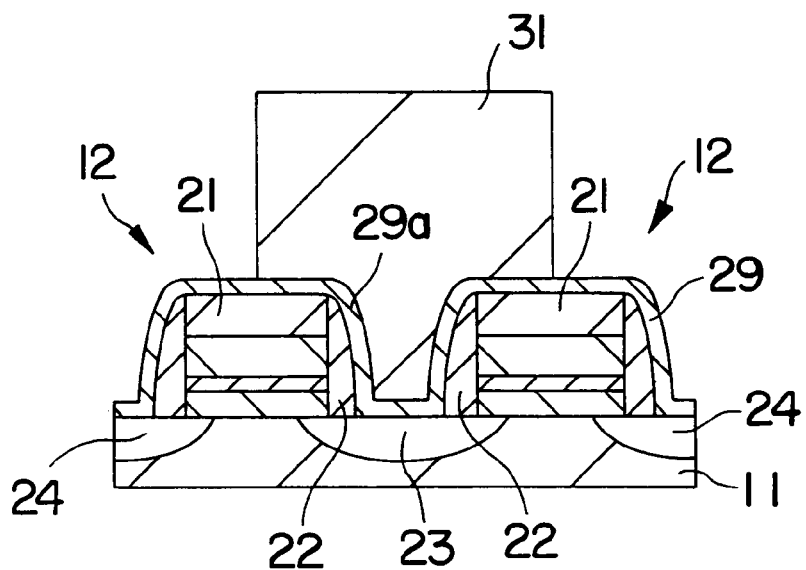
Figure 8D:
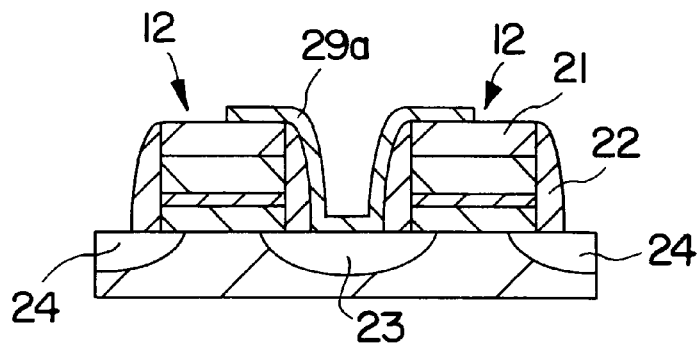
Figure 8E:
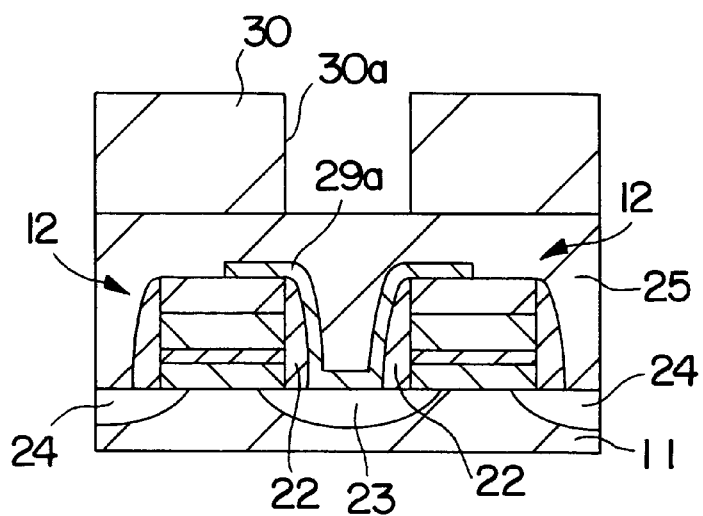

That is, in the first process, first, as shown FIGS. 8A and 8B, the etching stopper layer 29 covering the word line 12 and the semiconductor substrate 11 is formed in accordance with the same procedure as explained above. Then as shown in FIG. 8C, a resist pattern 31, which covers drain regions 23 and does not cover the source regions 24, is formed on the etching stopper layer 29. Then, portions of the etching stopper layer 29 are removed, and the resist pattern 31 is removed so as to form a structure provided with an etching stopper layer 29a covering not all of the surface of the substrate, but only that in the vicinity of the drain regions 23. Then, as shown in FIG. 8E, the intermediate insulating layer 25 and the resist pattern 30 are formed on this structure. Thereafter, the remaining processes such as the drain contact hole formation and the bit line formation are performed so as to fabricate nonvolatile semiconductor memories.

When this first process is used a nonvolatile semiconductor memory is finally fabricated in which the etching stopper layer 29 remains at only the upper portion of the word line 12. That is, a nonvolatile semiconductor memory is fabricated in which at both sides of the word line 12, there is nothing to block the hydrogen that had broken into the interface during the formation of the etching stopper 29 from getting out. Thus, when the first process is used, a nonvolatile semiconductor memory can be fabricated in which there is little variation in the electrical characteristics as between the respective memory cells.

Figure 9A:
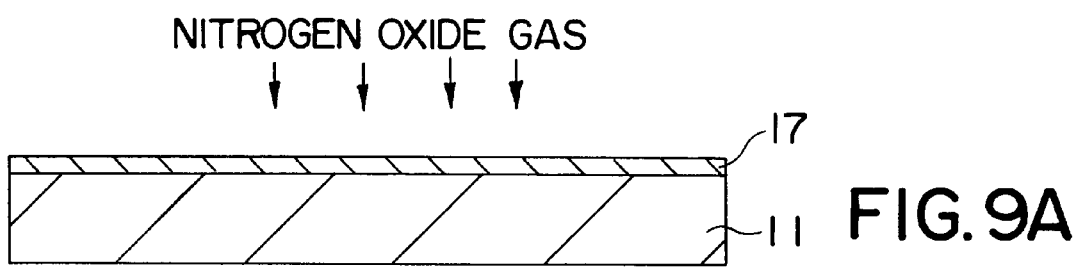
FIGS. 9A and 9B are sectional views of assistance in explaining a second process used when an etching stopping layer is formed in the method of fabricating nonvolatile semiconductor memories in accordance with the second embodiment.
Figure 9B:
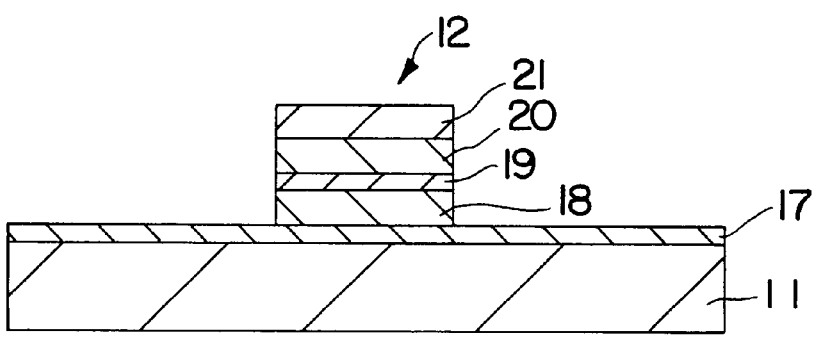

Next, the second process is explained referring to FIGS. 9A and 9B. As schematically shown in FIG. 9A, in the second process, a gate oxide film 17 is formed on the semiconductor substrate 11, and then the gate oxide film 17 is thermally treated in nitrogen oxide (NO or $NO_2$). Then as shown in FIG. 9B, the floating gate 18, the control gate 20 and the like are formed.

That is, in the second process, dangling bonds of the silicon (in the substrate 11) under the gate oxide film 17 is terminated with nitrogen, thereby to avoid storage of hydrogen in the interface between the substrate 11 and the gate oxide film 17.

Third Embodiment

In the method of fabricating a nonvolatile semiconductor memory in accordance with the third embodiment, a nonvolatile semiconductor memory is fabricated in which there is no useless area between word lines and source lines and between word lines and drain contact holes. That is, in this fabricating method, source lines are formed in accordance with the fabricating method of the first embodiment, and drain holes are formed in accordance with the fabricating method of the second embodiment. Moreover, in the third embodiment, word lines are formed into structures different from those of the word lines in the second embodiment.

Hereinafter, an explanation will be given of the method of fabricating a nonvolatile semiconductor memory in accordance with the third embodiment.

This fabricating method, similarly to the first embodiment, starts with a formation process for the field areas 15 (FIG. 1A). Then, the following processes are performed to form the word lines 12.

Figure 10A:
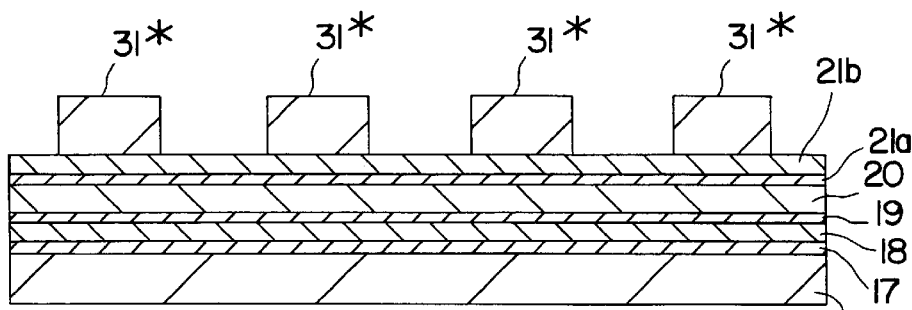
FIGS. 10A through 10D are sectional views of assistance in explaining a procedure for forming word lines in a method of fabricating nonvolatile semiconductor memories in accordance with the third embodiment.

First, as shown in FIG. 10A, the gate oxide 17, the floating gate 18, the inter-gates insulating layer 19, the control gate 20, a first insulating layer 21a and a second insulating layer 21a are formed in this order on the semiconductor substrate 11 in which the field areas 15 are formed. in this embodiment, silicon dioxide is deposited to form the first insulating layer 21a and silicon nitride is deposited to form the second insulating layer 21b. Note that, as described later, the second insulating layer 21b is provided to prevent the control gate 20 from being etched. The first insulating layer 21a is provided to use silicon nitride, which is a material difficult to form on the control gate 20 of tungsten silicide, as an etching mask. And, the layer of the first insulating layer 21a and the second insulating layer 21b also functions as a layer insulating between an object on the first insulating layer 21a and the control gate 20.

Figure 10B:
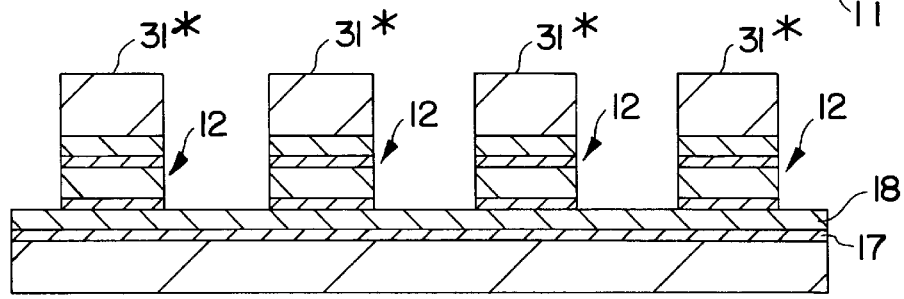

After formation of these six layers, as shown in FIG. 10B, the resist pattern 31, which covers only portions provided with the word lines 12, is formed on the second insulating layer 21b. Note that, the resist pattern is formed in such a manner that the word line 12 can be formed with a width is 0.5 μm, the interval for the source area is 0.36 μm and the interval for the drain region is 0.6 μm.

Figure 10C:
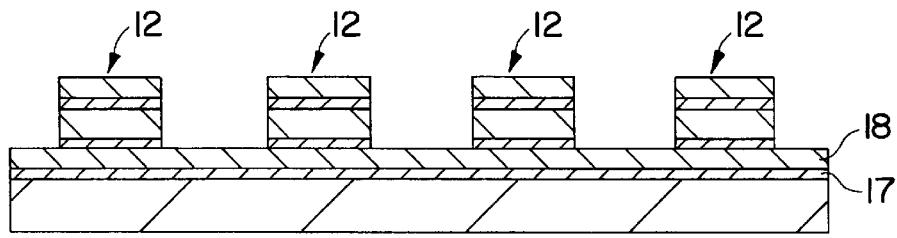

Thereafter, the etching is performed by using the resist pattern 31 as a mask, whereby, as shown in FIG. 10C, the inter-gates insulating layer 19, the control gate 20, a first insulating layer 21a and a second insulating layer 21b at portions except for the portions at which the lines 12 are formed, are removed.

Figure 10D:
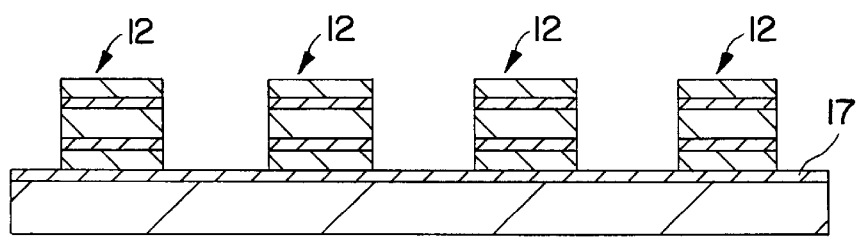

Then, as shown in FIG. 10C, the resist pattern 31 is removed. And, the etching is performed with etching gas (chlorine gas in this embodiment) that includes no carbon, and as shown in FIG. 10D, the structure, in which the floating gate 18 at portions except for the portion at which the word lines 12 are formed, are removed.

Further, the etching gas including no carbon is used, since the ratio of the etching speed Vp for polysilicon to be a component material of the floating gate 18, to the etching speed Vo for dioxide silicon to be a component material of the gate oxide layer 17, Vp/Vo, becomes larger. That is, to process the polysilicon layer without damage to the gate oxide layer 17 to be component materials of the word lines 12, the etching gas including no carbon is used. And, the same processes are applied to the structure of which the word lines 12 are formed, so as to form source areas.

Concretely, on the structure shown in FIG. 11A of which there are the second insulating layer 21*b* and the semiconductor substrate 11 (the active areas 16 and the field areas 15), a resist pattern 27 having openings which include areas to be source areas is formed, as shown in FIG. 11B. Then, the silicon dioxide (field areas 15) existing in areas in which source line areas are formed, are removed by using the resist pattern 27 as an etching mask. As already describe, in this embodiment, the surface layer of the word line 12 is the second insulating layer 21*b* of silicon nitride. Thus, while etching, there is no case that the portions not covered by the resist pattern 27 of the word line 12 (second insulating layer 21*b*) are etched. As a result, after etching and removing of the resist pattern 17, as shown in FIG. 11C, a structure of the word line 12 can be obtained in which the upper surface is planar.

Figure 12:
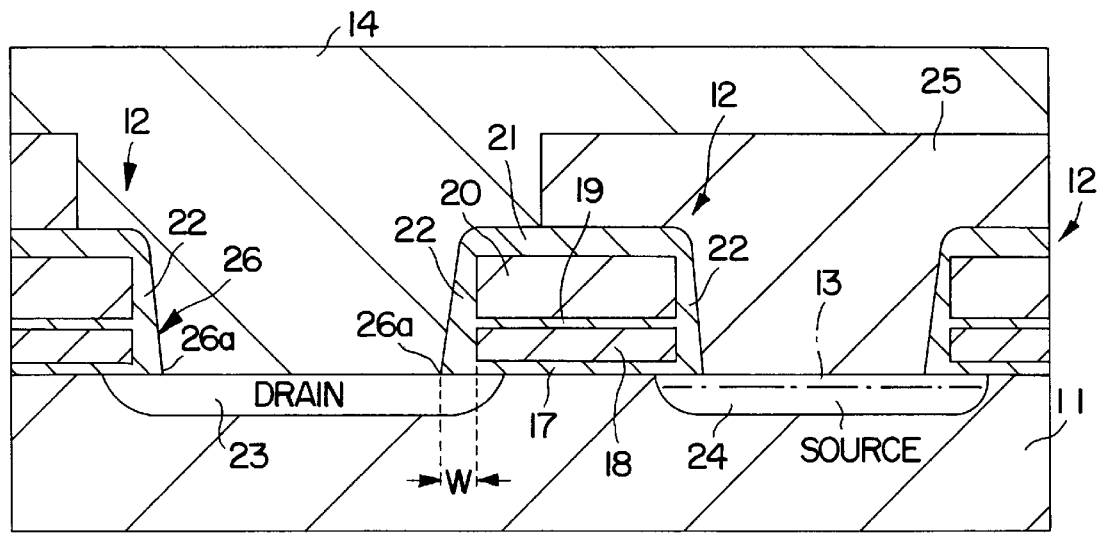
FIG. 12 is a sectional view of a nonvolatile semiconductor memory fabricated by the method of fabricating nonvolatile semiconductor memories in accordance with the third embodiment.
Figure 13:
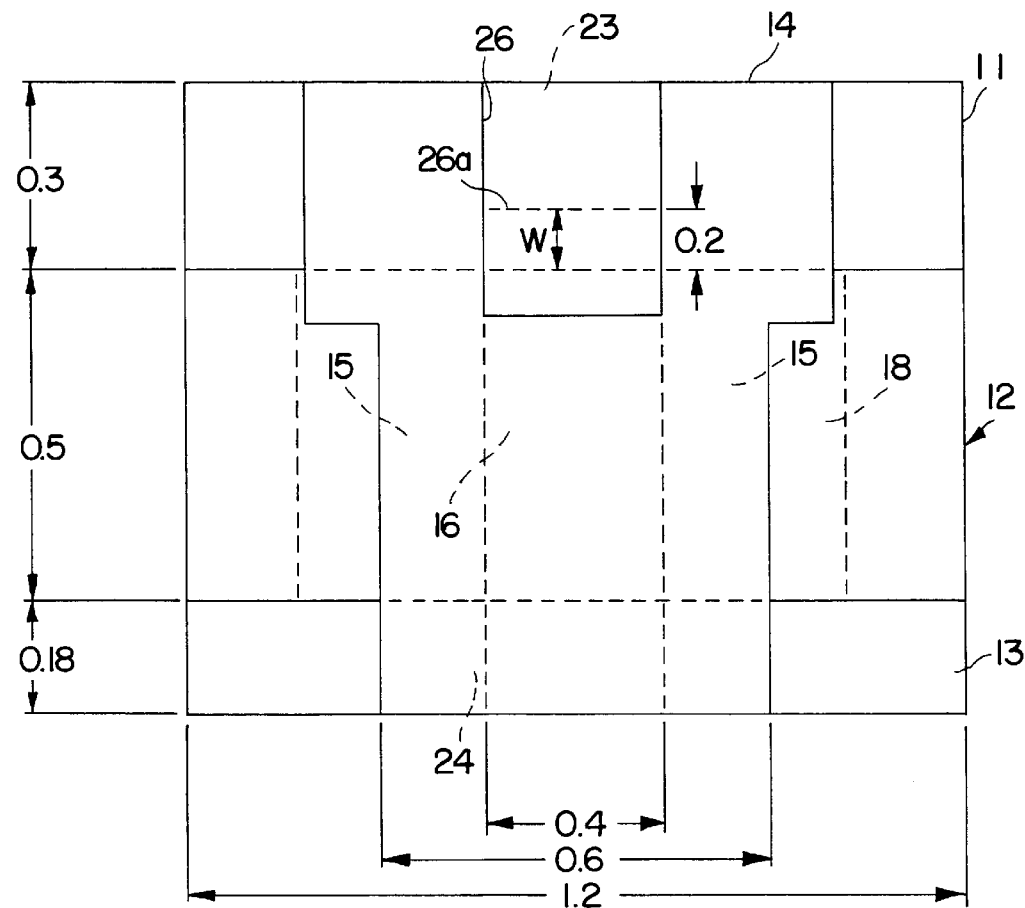
FIG. 13 is a planar view of one memory cell in a nonvolatile semiconductor memory fabricated by the method of fabricating nonvolatile semiconductor memories in accordance with the third embodiment.

Next, ions are implanted into the structure, and the source lines, source areas and drain regions are formed. And, drain contact holes and bit lines are formed in accordance with the procedure explained for the second embodiment, and, as shown in FIG. 12, a nonvolatile semiconductor memory is fabricated in which the source lines 13 and the areas functioning as the source areas 24, and the drain contact holes 26, are formed in self-aligning with the word lines 12. One memory cell corresponds to a half portion shown in FIG. 12, and, after all, the nonvolatile semiconductor memory according to this fabricating method, as shown in FIG. 13, has a memory cell of which the length in the bit line direction is 0.98 (=0.6/2+0.5+0.36/2) $\mu$m and the length in the word line direction is 1.2 $\mu$m . Therefore, according to this fabricating method, a nonvolatile semiconductor memory can be fabricated of which the cell area is 66% of the cell area (1.2 $\mu$m×1.48 $\mu$m) in the nonvolatile semiconductor memory fabricated in accordance with the conventional fabricating method.

As above described, according to this fabricating method, source lines and drain contact holes are formed independently of the accuracy of alignment of the photomask, so that a very compact nonvolatile semiconductor memory can be fabricated.

Fourth Embodiment

In the fourth embodiment, a procedure for fabricating a nonvolatile semiconductor memory is described in which a sub bit line and a main bit line (hereinafter, called a divided bit line memory) necessary for multi-layer interconnection use the fabricating method described in the third embodiment.

Figure 14A:
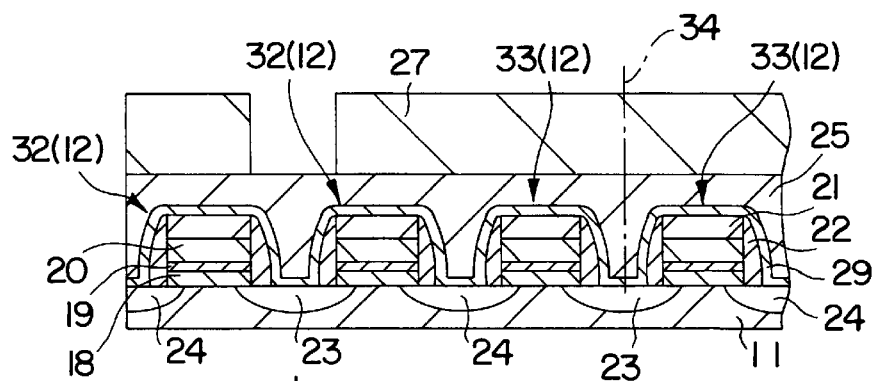
FIGS. 14A through 14D are sectional views of assistance in explaining a fourth embodiment; and, FIGS. 15A and 15B are sectional views of assistance in explaining a fifth embodiment.

First, an outline of the divided bit line memory fabricated in accordance with the fourth embodiment is explained with reference to FIG. 14D. FIG. 14D is a sectional view showing a partial structure of the divided bit line memory, and an actual divided bit line memory (not shown) has a right-left symmetrical structure provided with a symmetry axis (indicated by a one-dot chain line 34 in FIG. 14A) between two further word lines 33 (12) (not shown).

The divided bit line memory is provided with transistors functioning as memory cells and further transistors not functioning as memory cells. In FIG. 14D, transistors under two word lines 32 (12) shown at the right side, and not shown further word lines 32 (12) positioned at the further right side, are transistors functioning as memory cells. As above described, since the divided bit line memory has a right-left symmetrical structure, needless to say, transistors under the word lines at the right side function as memory cells.

The divided bit line memory is not provided with bit lines in common with the former transistor group and the latter transistor group, but a sub bit line 14*, electrically connecting to one another the drain regions 23 of transistors belonging to the same row in each transistor group, is provided.

And, the divided bit line memory is provided with a selecting transistor to select the sub bit lines 14*. In FIGS. 14A through 14D, transistors under two word lines shown at the right side function as selecting transistors. The drain regions 23 of these transistors are connected with the main bit line 14, which are not in contact with the sub bit lines 14* directly, and, in the divided bit line memory, one or some of the sub bit lines is electrically connected with the main bit line 14 corresponding to the status of these transistors under the word lines 33.

According to the fabricating method explained above for the third embodiment, a nonvolatile semiconductor memory of a structure like this can be fabricated to be compact. Concretely, first, in accordance with the same procedure explained for the third embodiment, the structure is formed so as to be provided with the drain regions 23, the source line areas 24, the word lines 12 (31, 32) and the intermediate insulating layer 25. And, as shown in FIG. 14A, the resist pattern 27 is formed on the structure, in which openings are formed only over the drain regions 23 of the transistors functioning as memory cells.

Figure 14B:
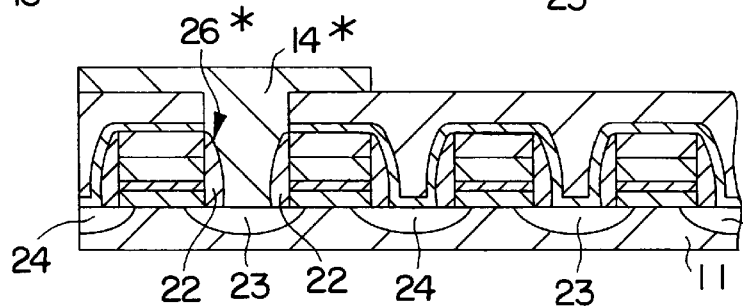

And, the drain contact holes 26* are formed by using the resist pattern 27 as an etching mask, and then conductive materials are deposited on the surface of the structure in which the drain contact holes 26* are formed, whereby, as shown in FIG. 14B, the structure in which the sub bit line 14* is formed, is obtained.

Figure 14C:
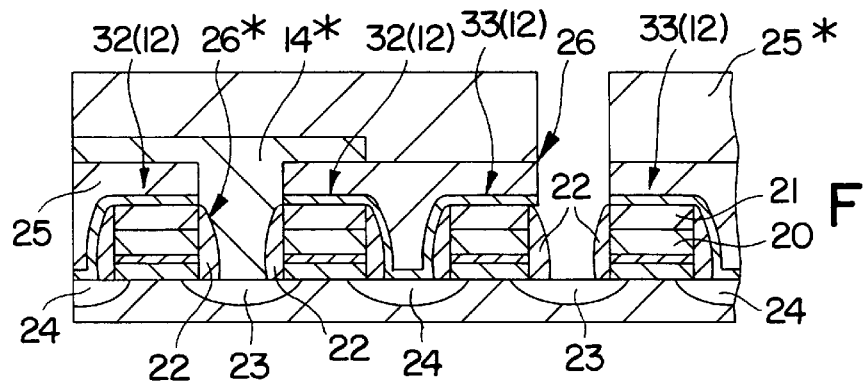
Figure 14D:
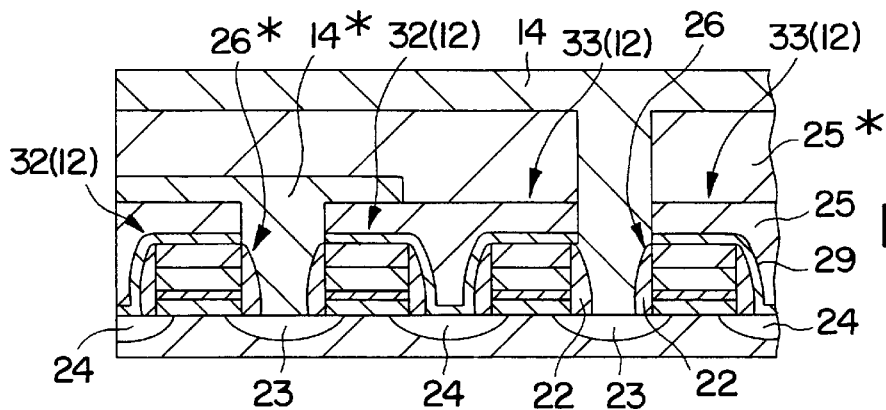

Then, the same process is applied repeatedly to the drain regions 23 of the selecting transistors, whereby as shown in FIG. 14C, the structure in which the drain contact holes 26 are formed, is obtained. Conductive materials are deposited on the surface of the structure in which the drain contact holes 26 are formed, whereby, as shown in FIG. 14D, the divided bit line memory is fabricated of the multi-layer structure with the sub bit lines 14* and the main bit line 14.

As above described, when the fabricating method explained for the fourth embodiment is used, it is unnecessary to provide areas for meeting positional aberrations because of using lithography around the selecting transistors. Therefore, a compact divided bit line memory can be formed.

Fifth Embodiment

When nonvolatile semiconductor memories are fabricated, circuits controlling memory cells are also formed in parallel with forming the memory cells. In the fifth embodiment, an example is in that the fabricating procedure described for the second embodiment is applied to the formation of such peripheral circuits.

Figure 15A:
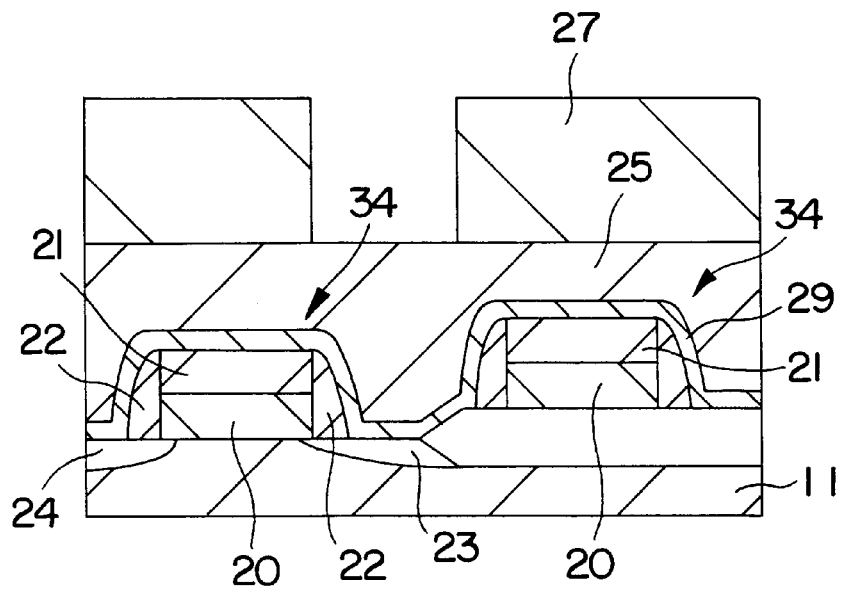

In addition, there are various circuits such as an X decoder an a Y decoder as the peripheral circuits. Thus, in this embodiment, referring to FIGS. 15A and 15B in which a part of the peripheral circuit is shown, an explanation will be given of an example in which the fabricating procedure described for the second embodiment is applied to the formation of such peripheral circuits.

The peripheral circuit is provided with two or more transistors having a source area and drain regions, respectively. When the fabricating procedure described for the third embodiment is applied, as shown in FIG. 15, the insulating layers 21 are formed on the control gates 20 of each transistor 34. Usually, the insulating layers 21 are formed at the same time that the insulating layers 21 of the word lines 12 are formed.

Then, the structure provided with the control gates 20 and the insulating layers 21 is treated similarly to the word lines 12. That is, the side walls 22 are formed at the side surfaces of the structure. And, the etching stopping layer 29 covering the side walls 22 and the insulating layers 21 of the transistor 34 is formed. Moreover, the intermediate insulating layer 25 is formed on the etching stopping layer 29, and the resist pattern 27, which has openings at portions corresponding to the drain regions 23 of the transistor 34, is formed on the intermediate insulating layer 25.

Figure 15B:
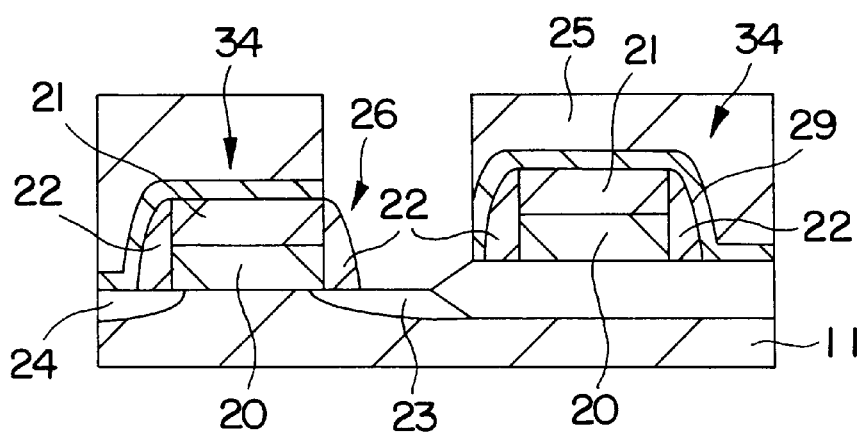

And, the processes explained above with reference to FIGS. 7F and 7G, namely, the etching of the intermediate insulating layer 25, the removal of the resist pattern 27 and the etching of the etching stopping layer 29, are applied to the structure (shown in FIG. 15A) formed in this way. As a result, as shown in FIG. 15B, a structure is formed which has the drain contact holes 26 in which the side walls 22 form parts of the side surfaces, and conductive materials are deposited on the structure. Then, the layer of conductive materials is patterned and etched for completing the interconnection of transistors 34.

As above described, the fabricating procedure explained for the second embodiment can be also applied to peripheral circuits. With this application, intervals between transistors to be components of a peripheral circuit can be made shorter than those of the conventional one. Therefore, when this fabricating method is also applied to the formation of peripheral circuits, much more compact nonvolatile semiconductor memories can be fabricated.

This invention being thus described, it will be apparent that the same may be varied in various ways. Such variations are not to be regarded as departures from the spirit and scope of the invention, and all such modifications that would be apparent to one skilled in the art are intended to be included within the scope of the following claims.

What is claimed is:

1. A method of fabricating a nonvolatile semiconductor memory, comprising:
    a word line forming step of forming plural word lines, each having an insulating layer of a first insulating material as a top layer, in parallel on a semiconductor substrate surface of a semiconductor substrate, in which field areas are formed;
    a doping step of doping impurity into the semiconductor substrate after the word line forming step in order to create source regions and drain regions and source lines at areas except for the field areas;
    a side wall forming step of forming side walls of second insulating materials on side surfaces toward the drain regions of the plural word lines;
    an etching stopping layer forming step of forming an etching stopping layer on an entire surface of the semiconductor substrate after the side wall forming step, wherein said etching stopping layer forming step includes forming an etching stopping layer having openings in areas except areas in which the drain regions are formed;
    an intermediate insulating layer forming step of forming an intermediate insulating layer of a third insulating material, which is different from the material used for the etching stopping layer, on the etching stopping layer;
    a resist pattern forming step of forming a resist pattern having openings in areas corresponding to the drain regions, on the intermediate insulating layer;
    a drain contact hole forming step of forming drain contact holes by etching the intermediate insulating layer using the resist pattern as a mask; and
    a bit line forming step of forming bit lines by depositing a conducting material on the intermediate insulating layer in which drain contact holes are formed, and patterning the deposited conducting material.

2. A method of fabricating a nonvolatile semiconductor memory, comprising:
    a word line forming step of forming plural word lines, each having an insulating layer of a first insulating material as a top layer, in parallel on a semiconductor substrate surface of a semiconductor substrate, in which field areas are formed;
    a doping step of doping impurity into the semiconductor substrate after the word line forming step in order to create source regions and drain regions and source lines at areas except for the field areas;
    a side wall forming step of forming side walls of second insulating materials on side surfaces toward the drain regions of the plural word lines;
    an etching stopping layer forming step of forming an etching stopping layer on an entire surface of the semiconductor substrate after the side wall forming step, wherein said etching stopping layer forming step includes forming the etching stopping layer of a conducting material consisting of etching stopping parts, each of the etching stopping parts covering one drain region;
    an intermediate insulating layer forming step of forming an intermediate insulating layer of a third insulating material, which is different from the material used for the etching stopping layer, on the etching stopping layer;
    a resist pattern forming step of forming a resist pattern having openings in areas corresponding to the drain regions, on the intermediate insulating layer;
    a drain contact hole forming step of forming drain contact holes by etching the intermediate insulating layer using the resist pattern as a mask; and
    a bit line forming step of forming bit lines by depositing a conducting material on the intermediate insulating layer in which drain contact holes are formed, and patterning the deposited conducting material.

3. A method of fabricating a nonvolatile semiconductor memory according to claim 2, wherein said conducting material is polysilicon or tungsten silicide or tungsten.

4. A method of fabricating a nonvolatile semiconductor memory according to claim 1, further comprising:
    a peripheral circuit forming step of forming a peripheral circuit including at least two transistors,
    wherein said side wall forming step includes forming the side walls on side surfaces of control gates of the transistors; and
    said resist pattern forming step includes forming a resist pattern having openings in areas corresponding to the drain regions of the transistors in the peripheral circuit.

5. A method of fabricating a nonvolatile semiconductor memory, comprising:

forming plural word lines, each having an insulating layer of a first insulating material as a top layer, in parallel on a semiconductor substrate surface of a semiconductor substrate, in which field areas are formed;

doping impurity into the semiconductor substrate after the forming plural word lines, in order to create source and drain regions and source lines at areas except the field areas;

forming side walls of second insulating materials on side surfaces toward the drain regions of the plural word lines;

forming an etching stopping layer on an entire surface of the semiconductor substrate after the forming side walls, said forming an etching stopping layer including forming an etching stopping layer having openings in areas except areas in which the drain regions are formed; and forming an intermediate insulating layer of a third insulating material, which is different from the material used for the etching stopping layer, on the etching stopping layer.

6. A method according to claim 5, wherein said forming plural word lines includes:

depositing on the semiconductor substrate a first layer which will eventually form gate oxides of the word lines;

thermally treating the semiconductor substrate on which the first layer is formed, in nitrogen oxide gas; and depositing second through fifth layers, which will eventually form a floating gate, an inter-gates insulating layer, a control gate and an insulating layer, respectively, on the first layer after the thermally treating.

7. A method of fabricating a nonvolatile semiconductor memory, comprising:

forming plural word lines, each having an insulating layer of a first insulating material as a top layer, in parallel on a semiconductor substrate surface of a semiconductor substrate, in which field areas are formed;

doping impurity into the semiconductor substrate after the forming plural word lines, in order to create source and drain regions and source lines at areas except the field areas;

forming side walls of second insulating materials on side surfaces toward the drain regions of the plural word lines;

forming an etching stopping layer on an entire surface of the semiconductor substrate after the forming side walls, wherein forming an etching stopping layer includes forming the etching stopping layer of a conductive material, the etching stopping layer consisting of etching stopping parts, each of the etching stopping parts covering one drain region; and forming an intermediate insulating layer of a third insulating material, which is different from the material used for the etching stopping layer, on the etching stopping layer.

8. A method according to claim 7, wherein said conducting material is polysilicon or tungsten silicide or tungsten.

9. A method according to claim 5, further comprising:

forming a peripheral circuit including at least two transistors, wherein said forming the side walls includes forming the side walls on side surfaces of control gates of the transistors; and said forming a resist pattern includes forming a resist pattern having openings in areas corresponding to the drain regions of the transistors in the peripheral circuit.

10. A method of fabricating a nonvolatile semiconductor memory according to claim 2, further comprising a peripheral circuit forming step of forming a peripheral circuit including at least two transistors, wherein said side wall forming step includes forming the side walls on side surfaces of control gates of the transistors, and wherein said resist pattern forming step includes forming a resist pattern having openings in areas corresponding to the drain regions of the transistors in the peripheral circuit.

* * * * *